(12) United States Patent
Hardy et al.

(10) Patent No.: US 11,340,323 B2
(45) Date of Patent: May 24, 2022

(54) LOW ACOUSTIC NOISE MAGNETIC RESONANCE IMAGE ACQUISITION

(71) Applicant: General Electric Company, Schenectady, NY (US)

(72) Inventors: Christopher Judson Hardy, Schenectady, NY (US); Thomas Kwok-Fah Foo, Clifton Park, NY (US); Ek Tsoon Tan, Halfmoon, NY (US)

(73) Assignee: General Electric Company, Schenectady, NY (US)

(*) Notice: Subject to any disclaimer, the term of this patent is extended or adjusted under 35 U.S.C. 154(b) by 290 days.

(21) Appl. No.: 16/735,228

(22) Filed: Jan. 6, 2020

(65) Prior Publication Data
US 2021/0208222 A1 Jul. 8, 2021

(51) Int. Cl.
*G01R 33/385* (2006.01)
*G01R 33/48* (2006.01)
*G01R 33/563* (2006.01)

(52) U.S. Cl.
CPC ..... *G01R 33/3854* (2013.01); *G01R 33/4806* (2013.01); *G01R 33/56341* (2013.01)

(58) Field of Classification Search
CPC ............ G01R 33/3854; G01R 33/4806; G01R 33/56341; G01R 33/543; G01R 33/56308; A61B 5/055
USPC ....................................................... 324/309
See application file for complete search history.

(56) References Cited

U.S. PATENT DOCUMENTS

| | | | |
|---|---|---|---|
| 6,076,006 A * | 6/2000 | Van Den Brink | G01R 33/56341 324/309 |
| 6,570,985 B1 * | 5/2003 | Romesburg | H04B 3/23 379/406.01 |
| 8,908,951 B2 | 12/2014 | Menzel et al. | |
| 9,681,821 B2 | 6/2017 | Piron et al. | |
| 10,132,889 B2 | 11/2018 | Gui et al. | |
| 2004/0071324 A1 * | 4/2004 | Norris | G01R 33/56509 382/128 |
| 2013/0053722 A1 * | 2/2013 | Carlson | A61B 5/316 607/45 |
| 2014/0300353 A1 * | 10/2014 | He | A61B 5/4312 324/309 |

(Continued)

FOREIGN PATENT DOCUMENTS

| | | |
|---|---|---|
| GB | 2337125 A | 11/1999 |
| WO | 2009074918 A1 | 6/2009 |
| WO | 2017061277 A1 | 4/2017 |

OTHER PUBLICATIONS

Ravicz, Michael E., Jennifer R. Melcher, and Nelson Y-S. Kiang. "Acoustic noise during functional magnetic resonance imaging." The Journal of the Acoustical Society of America 108.4 (2000): 1683-1696. (Year: 2000).*

(Continued)

*Primary Examiner* — Christopher P McAndrew

(57) ABSTRACT

The techniques discussed herein relate to a reduced acoustic noise and vibration magnetic resonance imaging (MRI) acquisition. In certain implementations acoustic noise levels for one or more MRI pulse sequences are characterized and modified by limiting the frequencies and amplitudes of the gradient waveforms so as to produce less noise and vibration when the modified waveform is used during an MRI examination. In this manner, relatively low sound pressure levels can be attained.

20 Claims, 7 Drawing Sheets

(56) References Cited

U.S. PATENT DOCUMENTS

2014/0347050 A1* 11/2014 Gui .................. G01R 33/3854
　　　　　　　　　　　　　　　　　　　　　　　　　324/309
2015/0115956 A1　　4/2015 Ackerman et al.

OTHER PUBLICATIONS

Ravicz, Michael E., and Jennifer R. Melcher. "Isolating the auditory system from acoustic noise during functional magnetic resonance imaging: examination of noise conduction through the ear canal, head, and body." The Journal of the Acoustical Society of America 109.1 (2001): 216-231. (Year: 2001).*
Bresch, Erik, et al. "Synchronized and noise-robust audio recordings during realtime magnetic resonance imaging scans." The Journal of the Acoustical Society of America 120.4 (2006): 1791-1794. (Year: 2006).*
Hall, Deborah A., et al. "Acoustic, psychophysical, and neuroimaging measurements of the effectiveness of active cancellation during auditory functional magnetic resonance imaging." The Journal of the Acoustical Society of America 125.1 (2009): 347-359. (Year: 2009).*
Ravicz, Michael E., et al.; "Acoustic noise during functional magnetic resonance imaging", The Journal of the Acoustical Society of America, vol. 108, Issue: 4, pp. 1683-1696, 2000.
Wu, Ziyue, et al., "Evaluation of an independent linear model for acoustic noise on a conventional MRI scanner and implications for acoustic noise reduction", Magnetic resonance in medicine, Apr. 2014 (published online Jun. 2013).

\* cited by examiner

LOW ACOUSTIC NOISE MAGNETIC RESONANCE IMAGE ACQUISITION

STATEMENT REGARDING FEDERALLY SPONSORED RESEARCH & DEVELOPMENT

This invention was made with Government support under contract number W81XWH-16-2-0054 awarded by the U.S. Congressional Directed Medical Research Program. The Government has certain rights in the invention.

BACKGROUND

The subject matter disclosed herein relates to acoustics and vibration associated with magnetic resonance imaging.

Non-invasive imaging technologies allow images of the internal structures or features of a patient to be obtained without performing an invasive procedure on the patient. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient.

For example, magnetic resonance imaging (MRI) examinations are based on the interactions among a primary magnetic field, a radiofrequency (RF) magnetic field, and time varying magnetic gradient fields with gyromagnetic material within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

Magnetic resonance imaging technique, however, tend to be associated with high levels of acoustic noise and vibration. While this may only a minor issue for typical examinations in which the patient is awake and alert, it may be problematic in sessions where the patient is intended to be relaxed or asleep. By way of example, the noise and vibration typically associated with magnetic resonance imaging may make the imaging modality unsuitable for use in sleep studies or in other contexts where the noise and vibration are disruptive.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In accordance with one embodiment, a method is provided for performing a magnetic resonance (MR) image acquisition. In accordance with this embodiment, for an acoustically dominant gradient axis of the MR image acquisition: a sound-pressure-level spectrum (SPLS) is calculated by weighting an amplitude spectrum w(f) of a gradient waveform with an acoustic response function (ARF) versus frequency (ARF) of the MR imaging system; one or more frequencies are selected within a frequency range on the ARF, wherein the one or more frequencies are selected to reduce acoustic noise; a modified gradient waveform is computed using the one or more frequencies; gradient waveforms on one or more other axes are synchronized with the modified gradient waveform; and the modified gradient waveform is used in the MR image acquisition to acquire MR image data. As used herein, the determination of which axis is acoustically dominant may comprise measuring the sound pressure level (such as in dBA) for each gradient axis with the other gradients off and then comparing the results. The gradient axis having the highest SPL is deemed to be acoustically dominant relative to the other axes. This test may also be applied to specific time segments within the gradient waveforms (i.e., different time intervals within the gradient waveform may be deemed to have different acoustically dominant axes).

In accordance with a further embodiment, a magnetic resonance (MR) imaging system is provided. In accordance with this embodiment, the MR imaging system comprises: an MR scanner comprising primary magnet coils, gradient coils, and an RF coil; and control and analysis circuitry in communication with the MR scanner and configured to operate the primary magnet coils, gradient coils, and the RF coil. The control and analysis circuitry is configured to execute one or more stored routines to cause acts to be performed comprising: for an acoustically dominant gradient axis of the MR image acquisition: calculating a sound-pressure-level spectrum (SPLS) by weighting an amplitude spectrum of the gradient waveform with an acoustic response function (ARF) versus frequency of the MR imaging system; selecting one or more frequencies within a frequency range on the ARF, wherein the one or more frequencies are selected to reduce acoustic noise; computing a modified gradient waveform using the one or more frequencies; synchronizing gradient waveforms on one or more other axes with the modified gradient waveform; and executing a pulse sequence on the MR imaging system based on the modified gradient waveform to acquire MR image data.

In accordance with an additional embodiment, a method is provided for acquiring magnetic resonance (MR) images of a patient in a quiet environment, such as in a case where the patient is expected to sleep throughout the MRI examination, or in MM examinations where loud noises typical of an MRI exam are desired to be suppressed. In accordance with this embodiment, for one or more pulse sequences, a sound-pressure-level spectrum (SPLS) is calculated based on an acoustic response function (ARF) of an MR imaging system and a gradient waveform amplitude spectrum of a respective gradient waveform from an acoustically dominant axis of each pulse sequence. For each SPLS, one or more frequencies are selected by identifying one or more local lows or minima within the ARF and selecting the one or more frequencies associated with the local lows or minima. For each SPLS, a modified gradient waveform is computed using the one or more frequencies. Gradient waveforms on one or more other axes are synchronized with the modified gradient waveform. MR scan data of a sleeping patient, as an example of an MRI examination where a quiet scan is desired, are acquired using one or more pulse sequences based on the modified gradient waveforms. One or more images are reconstructed based on the MR scan data. One or more imaging biomarkers are extracted from the one or more images.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
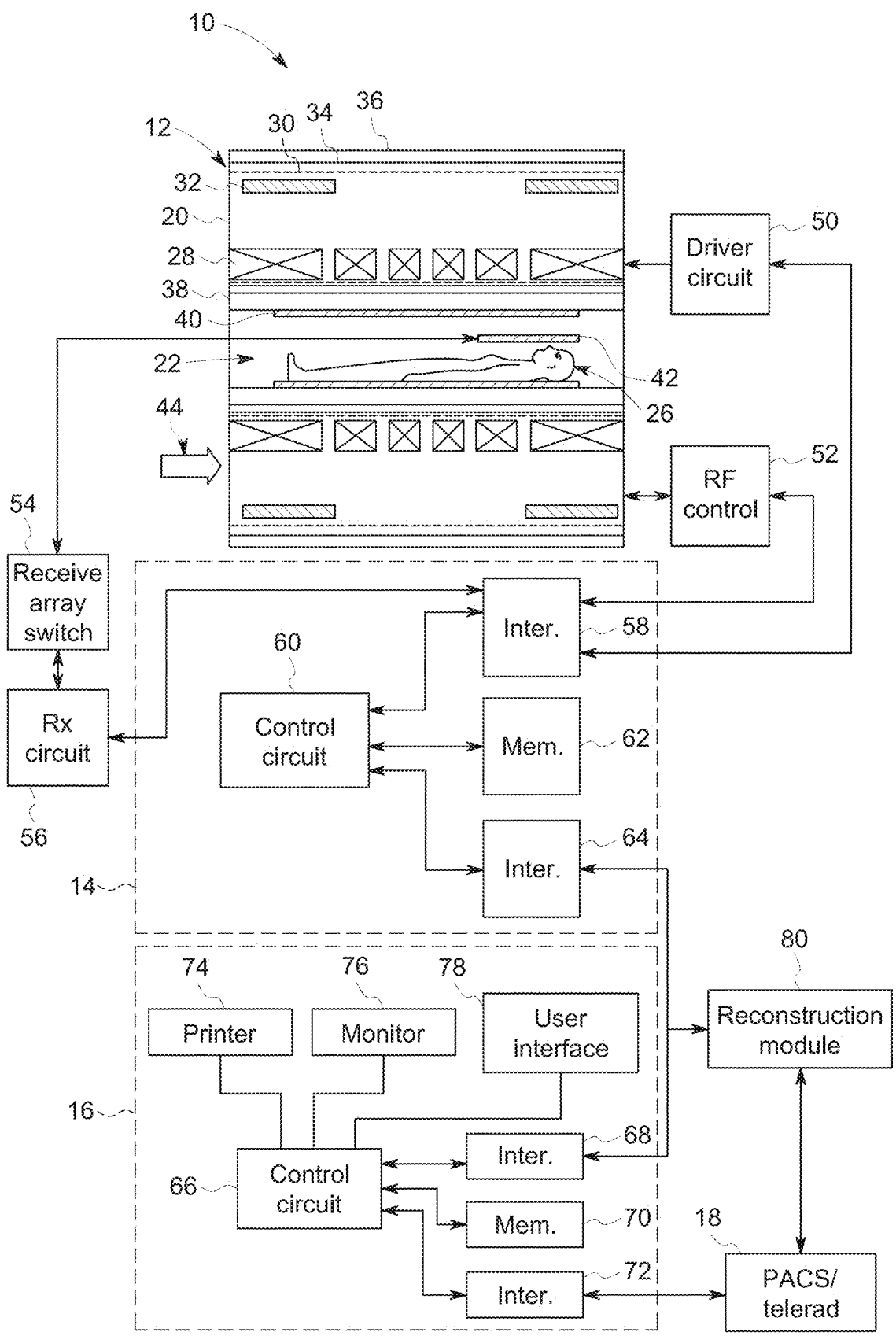
FIG. 1 illustrates a magnetic resonance imaging (MRI) system, in accordance with aspects of the present disclosure.

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Some generalized information is provided for both general context related to aspects of the present disclosure and to facilitate understanding and explanation of certain of the technical concepts described herein.

In general, magnetic resonance imaging (MRI) is based on the interactions of a primary magnetic field, time varying magnetic gradient fields, and a radiofrequency (RF) field with gyromagnetic material within a subject of interest (e.g., a patient). Certain gyromagnetic materials, such as hydrogen nuclei in water molecules, have characteristic behaviors in response to external electromagnetic (EM) fields (e.g., constant or time varying electric fields, magnetic fields, or a combination thereof). The precession of spins of these nuclei can be influenced by manipulation of the fields to produce RF signals that can be detected, processed, and used to reconstruct a useful image. In the context of medical imaging, MRI can non-invasively allow visualization of biomarkers as well as the flow or diffusion of such biomarkers within the human body. However, acquisition of MRI data is typically associated with high acoustic noise levels, which may make it unsuitable for certain contexts. In particular, currents in MRI gradients generate Lorentz forces in the strong (i.e., primary) magnetic field, resulting in strong vibrations and acoustics. The high level of acoustic noise and vibration may make MRI unsuitable for imaging a patient while asleep, such as for a sleep study.

With the preceding in mind, the techniques described herein may be used to address the high acoustic noise levels and vibration typically associated with MM. By way of example, in certain implementations, acoustic noise levels for one or more MRI pulse sequences are characterized and modified by limiting the frequencies and amplitudes of the gradient waveforms so as to produce less noise and vibration when the modified waveforms are used during an MRI examination. In this manner, relatively low sound pressure levels can be attained that are conducive to the patient being able to sleep while being imaged.

The low-noise, low-vibration MRI acquisition described herein may enable any MRI acquisition process to be feasibly acquired during sleep or when a quiet MRI scan is desired. This in turn may allow image reconstruction and the extraction of MM-based imaging biomarkers, detection of brain activity changes, and/or measurement of changes due to diffusivity or flow in the brain while the patient sleeps or in the absence of auditory stimuli. Such an MRI measurement during sleep may be useful for measuring physiologic changes (such as blood flow, brain activity, and/or glymphatic flow) that may be implicated in neurodegenerative disease, stroke, or traumatic brain injury. Measurements of brain activity or function during a quiet MRI examination will exclude brain activity derived primarily from the auditory stimulation from the typical noise associated with a conventional MRI examination.

Further, the imaging biomarkers acquired in accordance with the low-noise, low-vibration techniques described herein can be synchronized with other, non-MM inputs (such as brain waves, sleep stage, spindles, and so forth) for correlation of physiologic stages. By way of example, brain activity may be acquired using EEG, which involves additional setup and costs when measured with MRI. Further, functional MRI (fMRI) acquisition can provide brain activity information, but typically has very high acoustic noise. By using a low-acoustic-noise fMRI acquisition, the brain activity information can be used to determine the presence of different brain waves that may be indicative of different stages of sleep, such as Delta waves, which are present during REM sleep. In addition, in other examinations, low-acoustic-noise fMRI acquisition can be used to determined brain activation and connectivity patterns that are not confounded by auditory responses or stimuli, allowing a better assessment of brain activity patterns.

Another potential benefit of the low-acoustic-noise MRI described herein relates to the capability of assessing fluid flow and metabolite clearance mechanisms in the brain during sleep, such as glymphatic flow and interstitial fluid flow. Such measurements currently require tracer studies that are invasive and require contrast agents. Diffusion and flow MRI acquisition can provide diffusivity and velocity (i.e., flow) information that depict presence of fluid flow and metabolite clearance. Furthermore, glymphatic flow has been demonstrated to occur only in Stage 3 sleep in animal studies, and has never been demonstrated noninvasively in human studies. The ability to perform a low-acoustic-noise, low-vibration diffusion and flow MRI acquisition in accordance with the presently described techniques will allow changes in flow clearance to be detected during sleep. In addition, other MR imaging techniques, such as those utilizing a single diffusion sequence to provide both diffusivity and velocity information, may be performed during sleep in accordance with the present techniques.

While the preceding describes various benefits of the low-noise, low-vibration techniques described herein, additional steps may be taken to address possible performance degradation attributable to reducing noise levels by modifying the pulse sequences. For example, in one embodiment the gradient waveform output may be modified on a waveform-by-waveform basis to balance (e.g., optimize) acceptable acoustic noise levels and performance so as to limit performance degradation. In particular, lower waveform frequencies and amplitudes generally result in degradation of MRI performance or substantial de-rating of the MRI gradient slew rate, resulting in longer echo times (producing lower SNR) and longer echo spacing (producing worse image distortion). As discussed herein, a balance may be achieved by limiting the frequencies and amplitudes to achieve adequate MRI performance.

With the preceding in mind, the embodiments described herein may be implemented using or on an MRI system, wherein specific imaging routines are initiated by a user (e.g., a radiologist). Thus, the system may perform data acquisition, data reconstruction, and in certain instances, image synthesis. Accordingly, referring to FIG. 1, an imaging system 10 is illustrated schematically as including a scanner 12, scanner control circuitry 14, and system control circuitry 16.

The imaging system 10 additionally includes remote access and storage systems 18 and/or devices such as picture archiving and communication systems (PACS), or other devices such as teleradiology equipment so that data acquired by the imaging system 10 may be accessed on- or off-site. In this way, MRI data may be acquired, followed by on-or off-site processing and evaluation. While the imaging system 10 may include any suitable scanner or detector, in the illustrated embodiment, the imaging system 10 includes a full body scanner 12 having a housing 20 through which an opening (e.g., an annular opening) is formed to accommodate a bore tube 22. The bore tube 22 may be made of any suitable material such as a non-metallic and/or non-magnetic material. A table is moveable into the bore tube 22 to permit a patient 26 to be positioned therein for imaging selected anatomy within the patient. In some embodiments, the bore tube 22 may surround an entire subject or just a portion thereof (e.g., a patient's head, thorax, or extremity). In some embodiments, the bore tube 22 may support the table and/or articulation components (e.g., a motor, pulley, and/or slides).

The scanner 12 may include a series of associated conductive coils for producing controlled electromagnetic fields for exciting the gyromagnetic material within the anatomy of the subject being imaged. Specifically, primary magnet coils 28 are provided for generating a primary magnetic field, which is generally aligned with the bore tube 22. The primary magnetic coils 28 and shielding coils 32 may be made of a superconductive material. In some embodiments, a thermal shield 34 and a vacuum vessel 36 encloses the coils 28, 32. Also, in some MR magnets, such as a helium-bath-cooled magnet, a cryogen (e.g. helium) vessel 30 may help the coils maintain a low temperature. In other embodiments of MRI magnets, such as in a conduction-cooled or thermosiphon-cooled magnet, a helium vessel 30 may not be necessary to maintain a cryogenic temperature.

A series of gradient coils (collectively 38) permit controlled magnetic gradient fields to be generated for positional encoding of certain of the gyromagnetic nuclei within the patient 26 during examination sequences. Additionally, an RF coil 40 may generate radio frequency pulses for exciting the certain gyromagnetic nuclei within the patient 26. In addition to the coils that may be local to the scanner 12, the imaging system 10 may also include a set of receiving coils 42 (e.g., an array of coils) to be placed proximal to (e.g., against) the patient 26. As an example, the receiving coils 42 can include cervical/thoracic/lumbar (CTL) coils, head coils, single-sided spine coils, and so forth. Generally, the receiving coils 42 are placed close to or on top of the patient 26 so as to receive the weak RF signals (e.g., weak relative to the transmitted pulses generated by the scanner coils) that are generated by certain of the gyromagnetic nuclei within the patient 26 as they return to their relaxed state. In some embodiments, the RF coils 40 may both transmit and receive RF signals accomplishing the role of the receiving coils 42. In other embodiments, the receiving coils 42 may be able to transmit RF signals to RF coils 40.

The various coils of the imaging system 10 may be situated within the housing 20 of the scanner 12, and are controlled by external circuitry to generate the desired field and pulses, and to read emissions from the gyromagnetic material in a controlled manner. In the illustrated embodiment, a main power supply 44 provides power to the primary magnetic coils 28 to generate the primary magnetic field. A driver circuit 50 may include amplification and control circuitry for supplying current to the coils as defined by digitized pulse sequences output by the scanner control circuitry 14.

An RF control circuit 52 is provided for regulating operation of the RF coil 40. The RF control circuit 52 includes a switching device for alternating between the active and inactive modes of operation, wherein the RF coil 40 transmits and does not transmit signals, respectively. The RF control circuit 52 may also include amplification circuitry to generate the RF pulses. Similarly, the receiving coils 42, or RF coils 40 if no separate receiving coils 42 are implemented, are connected to a switch 54, which is capable of switching the receiving coils 42 between receiving and non-receiving modes. Thus, the receiving coils 42 may resonate with the RF signals produced by relaxing gyromagnetic nuclei from within the patient 26 while in the receiving mode, and avoid resonating with RF signals while in the non-receiving mode. Additionally, a receiving circuit 56 may receive the data detected by the receiving coils 42 and may include one or more multiplexing and/or amplification circuits.

It should be noted that while the scanner 12 and the control/amplification circuitry described above are illustrated as being connected by single lines, one or more cables or connectors may be used depending on implementation.

For example, separate lines may be used for control, data communication, power transmission, and so on. Further, suitable hardware may be disposed along each type of line for the proper handling of the data and current/voltage. Indeed, various filters, digitizers, and processors may be disposed between the scanner 12 and the scanner control circuitry 14 and/or system control circuitry 16.

As illustrated, the scanner control circuitry 14 includes an interface circuit 58, which outputs signals for driving the gradient field coils 38 and the RF coil 40 and for receiving the data representative of the magnetic resonance signals produced in examination sequences. The interface circuit 58 may be connected to a control and analysis circuit 60. The control and analysis circuit 60 executes the commands to the driver circuit 50 and the RF control circuit 52 based on defined protocols selected via system control circuitry 16.

The control and analysis circuit 60 may also serve to receive the magnetic resonance signals and perform subsequent processing before transmitting the data to system control circuitry 16. Scanner control circuitry 14 may also include one or more memory circuits 62, which store configuration parameters, pulse sequence descriptions, examination results, and so forth, during operation.

A second interface circuit 64 may connect the control and analysis circuit 60 to a system control circuit 66 for exchanging data between scanner control circuitry 14 and system control circuitry 16. The system control circuitry 16 may include a third interface circuit 68, which receives data from the scanner control circuitry 14 and transmits data and commands back to the scanner control circuitry 14. As with the control and analysis circuit 60, the system control circuit 66 may include a computer processing unit (CPU) in a multi-purpose or application specific computer or workstation. System control circuit 66 may include or be connected to a second memory circuit 70 to store programming code for operation of the imaging system 10 and to store the processed coil data for later reconstruction, display and transmission. The programming code may execute one or more algorithms that, when executed by a processor, are configured to perform reconstruction of acquired data.

An additional input output (I/O) interface 72 may be provided for exchanging coil data, configuration parameters, and so forth with external system components such as remote access and storage systems 18. Finally, the system control circuit 66 may be communicatively coupled to various peripheral devices for facilitating an operator interface and for producing hard copies of the reconstructed images. In the illustrated embodiment, these peripherals include a printer 74, a monitor 76, and a user interface 78 including, for example, devices such as a keyboard, a mouse, a touchscreen (e.g., integrated with the monitor 76), and so forth.

In some embodiments, a reconstruction module 80 may be implemented to reconstruct coil data into a viewable image. Furthermore, the reconstruction module 80 may be implemented as software to be executed by one or more processors of a computer system. Additionally or alternatively, the reconstruction module may include a computer, including memory and one or more processors, on which software modules may be run. Reconstructed images may be sent, for example, to a storage system 18 and/or to the monitor 76 for viewing.

Figure 2:
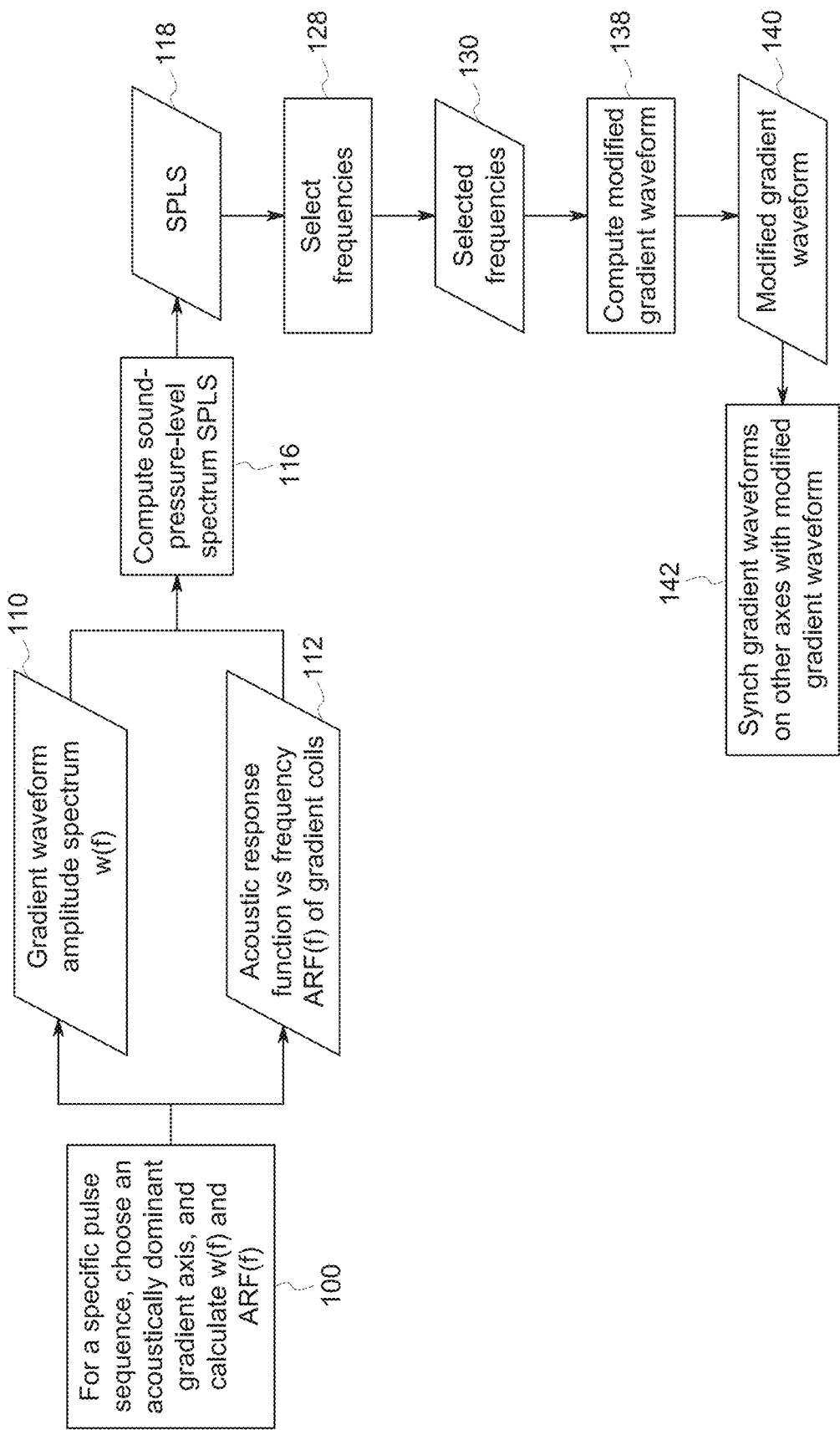
FIG. 2 depicts an example of a process flow for determining modified gradient waveforms, in accordance with aspects of the present disclosure.

With the preceding in mind, and turning to FIG. 2, an example of a process flow for modifying a gradient waveform is illustrated. As shown in this process flow example, an acoustically dominant gradient axis is first chosen (step 100). This may be the axis that, for the specific pulse sequence under consideration, produces the highest sound pressure levels (SPL). For example, as used herein the determination of which axis is acoustically dominant may comprise measuring the sound pressure level (such as in dBA) for each gradient axis with the other gradients off and then comparing the results. The gradient axis having the highest SPL is deemed to be acoustically dominant relative to the other axes for a given gradient waveform. This test may also be applied to specific time segments within the gradient waveforms (i.e., different time intervals within the gradient waveform may be deemed to have different acoustically dominant axes).

Figure 3:
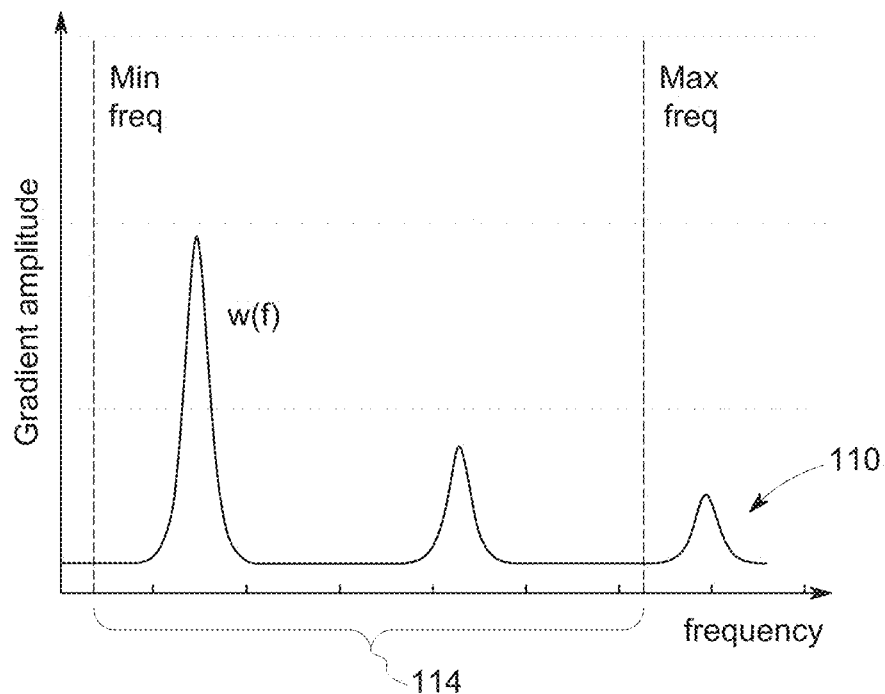
FIG. 3 depicts an example of a graphical plot of a gradient waveform amplitude spectrum w(f), in accordance with aspects of the present disclosure.
Figure 4:
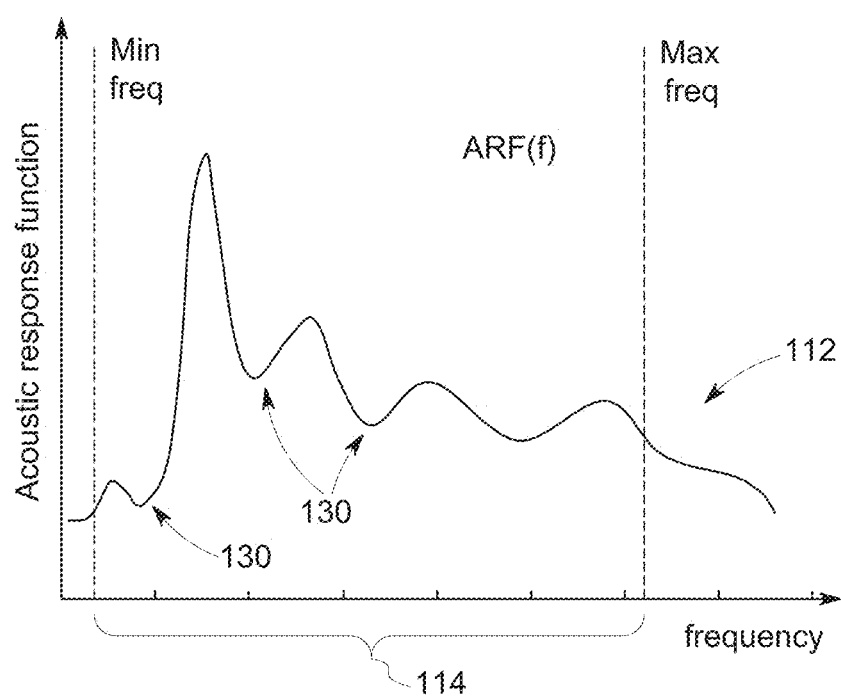
FIG. 4 depicts an example of a graphical plot of an acoustic response function as a function of frequency ARF (f) for a respective MRI system, in accordance with aspects of the present disclosure.

For the acoustically dominant axis, a gradient waveform amplitude (associated with a pulse sequence) as a function of frequency (referred to by reference number 110 or as w(f), an example of which is shown in FIG. 3), and an acoustic response function (ARF) of a respective MRI system, which may take the form of sound-pressure level per gradient amplitude as a function of frequency (referred to by reference number 112 or as ARF(f), an example of which is shown in FIG. 4) are initially provided or acquired. By way of example, FIG. 4 depicts an example of ARF 112 plotted as a function of frequency as measured or determined by acoustic noise characterization of the MRI gradient magnet system (e.g., gradient coils 38). Similarly, FIG. 3 depicts an example of a characterization of a pulse-sequence gradient waveform, here a gradient-waveform amplitude-versus-frequency characterization w(f) 110, for a given pulse sequence gradient waveform. In this example a suitable range of frequencies (i.e., frequency range 114 as shown in FIGS. 3 and 4) is determined based on one or more of the hardware performance limits or by performance criteria (such as echo times, echo spacing, and so forth). By way of example, a minimum frequency may be determined based on what is needed to accomplish the relevant imaging response to the pulse sequence while the maximum frequency may be the maximum allowable frequency based on the imaging system, patient, or protocol.

Figure 5:
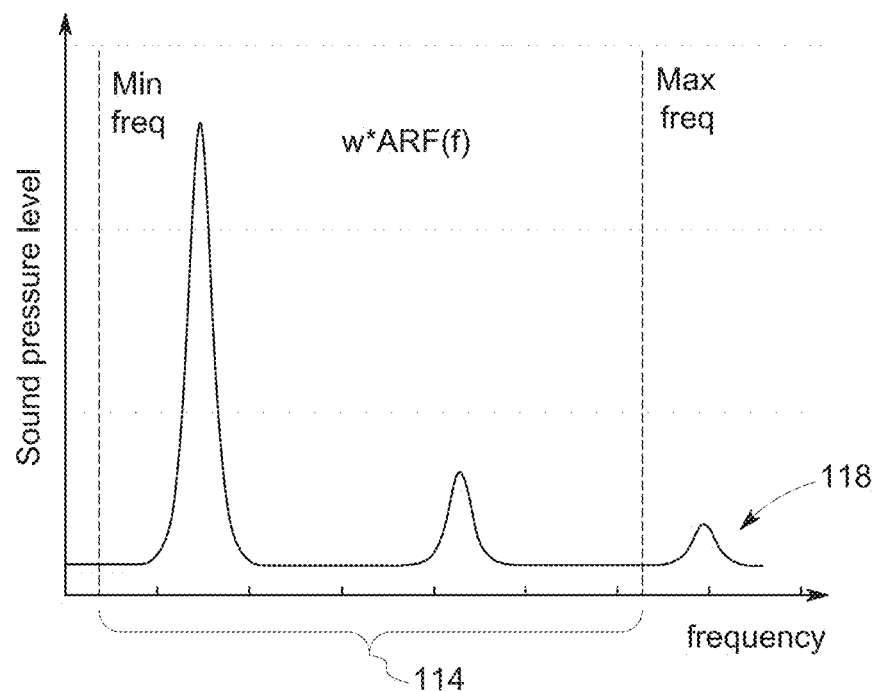
FIG. 5 depicts an example of a graphical plot of a sound-pressure-level spectrum (SPLS), in accordance with aspects of the present disclosure.

Turning back to FIG. 2, the ARF(f) 112 and w(f) 110 are used as inputs to compute (step 116) or otherwise determine a sound-pressure-level spectrum SPLS 118. In one example, the ARF(f) 112 is used to weight (e.g., multiply) the waveform amplitude spectrum w(f) 110 at each frequency to generate the SPLS 118. In such an example, the SPLS 118 corresponds to the noise level one would experience when the pulse sequence corresponding to w(f) is performed on the MRI system characterized by ARF(f) 112. An example of an SPLS 118 is shown in FIG. 5.

As shown in FIGS. 2 and 4, based on the ARF 112, one or more suitable (e.g., optimal) frequencies 130 within the allowable range 114 of frequencies are selected (step 128). By way of example, the selected frequencies 130 can be identified as being local lows or minima within the ARF 112 that reduce or minimize the SPLS 118. In one such example, frequencies may be selected 128 that are equal to or higher than the minimum frequency of frequency range 114 that minimize the acoustic noise. A modified gradient waveform 140 (e.g., a low acoustic noise gradient waveform) is computed (step 138) using the selected frequencies 130. By way of example, computing the low-acoustic-noise gradient waveform may include modifying the frequencies and amplitudes of the initial gradient waveform(s) needed for the MRI acquisition based on the selected frequencies.

Figure 6:
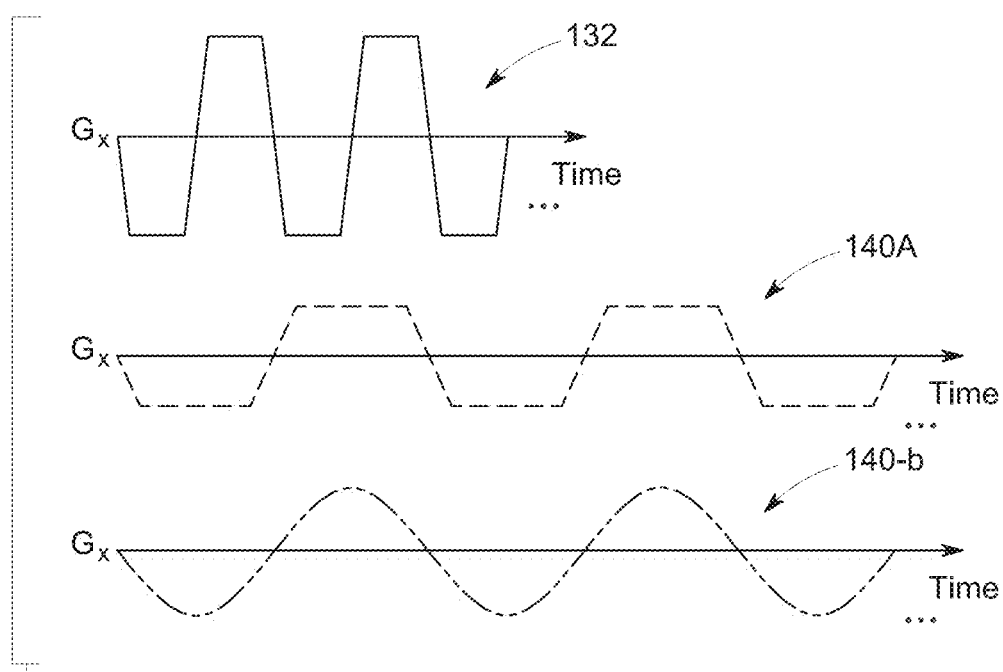
FIG. 6 depicts an example of a graphical plot of a gradient waveform before and after one or two steps of modification, in accordance with aspects of the present disclosure.
Figure 7:
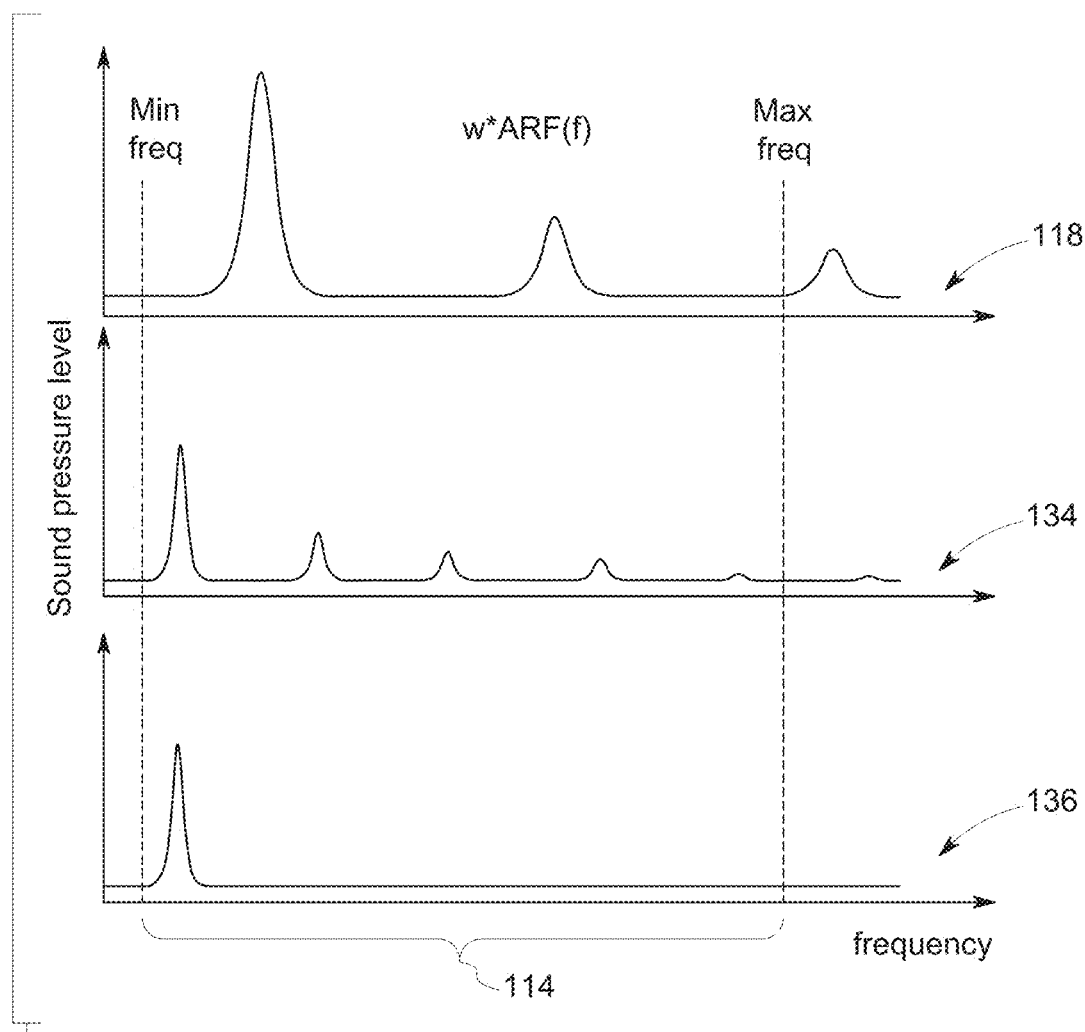
FIG. 7 depicts an example of a graphical plot of a gradient SPLS before and after one or two steps of modification, in accordance with aspects of the present disclosure.

FIG. 6 shows an example of such a modification, for an echo-planar readout gradient. The original waveform 132 corresponds to the original gradient-amplitude waveform spectrum 110 in the frequency domain. The gradient waveform is modified in this example by doubling its width and halving its amplitude, resulting in modified gradient waveform 140A. The doubled width results in a fundamental frequency that is half the original, allowing positioning close to a minimum in the acoustic response function 112. The halved gradient amplitude produces further reductions in SPL. Note, in this example the receiver bandwidth is also halved. The frequency content of the gradient waveform can be modified further by altering its shape away from trapezoidal, e.g., to sinusoidal, producing modified gradient waveform 140B. This serves to reduce or eliminate harmonic content, yielding further reductions in SPL. In this case regridding is performed as part of the image reconstruction process. FIG. 7 shows the results of these modifications on the SPLS (in the frequency domain). Specifically, SPLS waveform 118 corresponds to the original gradient waveform 132, SPLS waveform 134 corresponds to modified gradient waveform 140A, and SPLS waveform 136 corresponds to modified gradient waveform 140B. Turning back to FIG. 2, the gradient waveforms on the other axes are synchronized (step 142) with the modified gradient waveform(s) 140. The low-acoustic-noise modified gradient waveform(s) 140 can then be used as part of an MRI acquisition to allow image data to be acquired based on the desired pulse sequence but with less acoustic noise and/or vibration such that the patient may, in certain implementations, be asleep during the acquisition.

As a variation on the process shown in FIG. 2, the pulse sequence may be divided into different time segments, and the process of FIG. 2 applied separately to each time segment. In this scenario, a different dominant gradient axis may be determined for each time segment, and the process for modifying gradient waveforms applied to that axis accordingly. Additionally, this approach affords a localized treatment where only specific segments of the gradient waveforms on each axis are modified. That is, it addresses only the dominant source of acoustic noise from the analysis of the SPLS and waveform amplitude spectrum.

Figure 8:
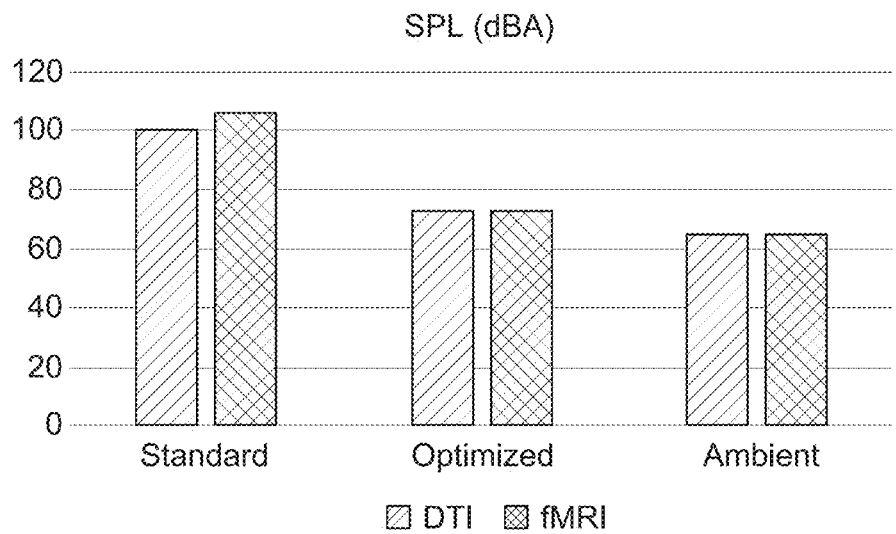
FIG. 8 depicts plots of acoustic noise measures for conventional pulse sequences, acoustic-noise-reduced pulse sequences, and ambient noise, in accordance with aspects of the present disclosure.

By way of example, and turning to FIG. 8, an example of results of the techniques discussed herein is provided in graphical form. As shown in FIG. 8, the vertical axis shows sound pressure levels (SPL) as measured in A-weighted decibels (dBA). A diffusion weighted/tensor imaging (DTI) pulse sequence and fMRI pulse sequence with no adjustment for noise (i.e., standard implementation) are shown on the left. As seen in this example, the SPL associated with both sequences is approximately 100 dBA, with the fMRI sequence slightly exceeding 100 dBA. Conversely, acoustic noise-optimized versions of the same pulse sequences calculated using the techniques discussed herein are shown in the middle of the graph. In this example, the SPL associated with both the acoustic noise-reduced DTI and fMRI pulse sequences was approximately 70 dBA. Ambient (i.e., background) noise at the test site, shown on the right, was less than the acoustic noise associated with the noise-reduced pulse sequences, but still more than 60 dBA.

Figure 9:
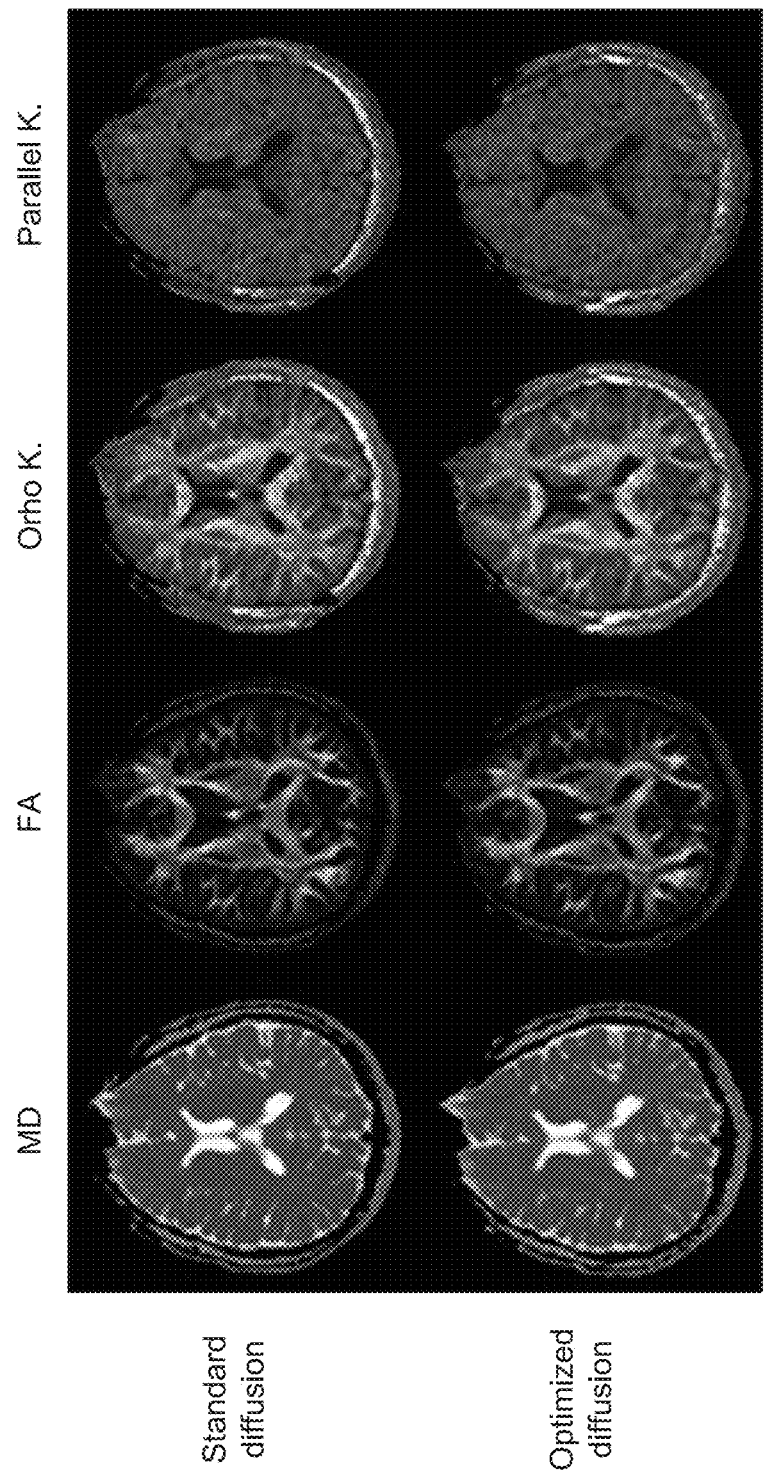
FIG. 9 depicts examples of MR image quality for conventional pulse sequences and acoustic-noise-reduced pulse sequences, in accordance with aspects of the present disclosure.

In addition, with respect to image quality FIG. 9 visually illustrates the relative image quality of MR diffusion images obtained using conventional pulse sequences relative to MR diffusion images obtained using pulse sequences having reduced acoustic noise characteristics during acquisition. In this example, mean diffusivity (MD), fractional anisotropy (FA), orthogonal K (kurtosis), and parallel K images are shown that were acquired using conventional pulse sequences (top row) and acoustic noise optimized versions of the same pulse sequences calculated using the techniques discussed herein (bottom row). As shown in this example, comparable image quality was obtained using both the conventional and acoustic noise reduced pulse sequences.

Figure 10:
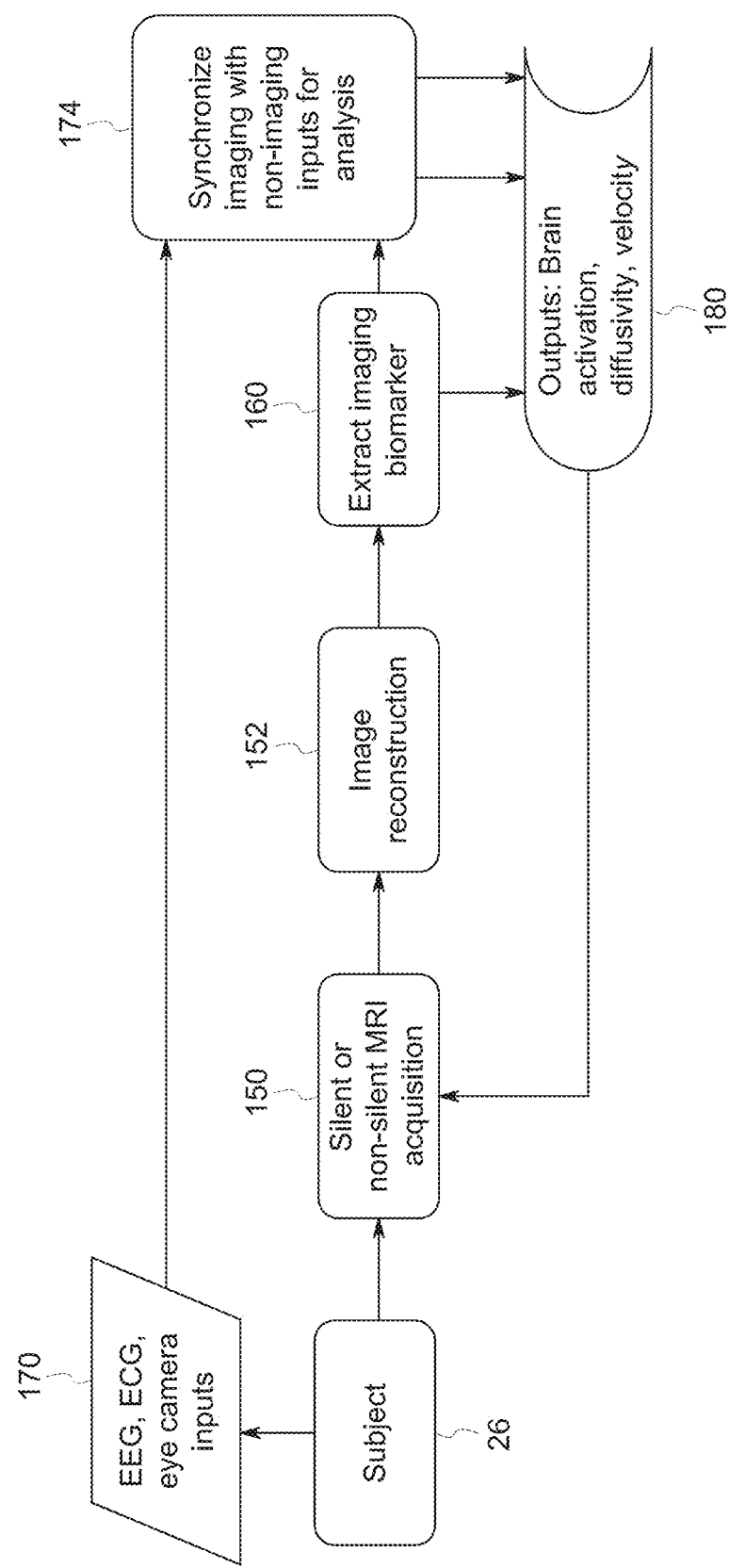
FIG. 10 depicts an example of a process flow for monitoring a sleeping patient, in accordance with aspects of the present disclosure.

With the preceding in mind, and turning to FIG. 10, a process flow is provided of an example of an implementation in which a patient 26 undergoes an MRI scan (step 150). In accordance with one embodiment, the patient 26 is asleep during the scan 150, though the patient 26 may in other embodiments be awake. In accordance with certain implementations, the MRI scan 150 may employ pulse sequences generated or modified using the techniques discussed herein so as to have low or reduced acoustic noise characteristics. Image data acquired by MRI scan 150 may be reconstructed (step 152) to generate one or more images or volumes. The reconstructed images or volumes may then be processed to extract (step 160) one or more imaging biomarkers. By way of example, in an implementation where the MRI is an fMRI acquisition, the extracted imaging markers may correspond to brain activity. Conversely, in an implementation where the MRI is a diffusion or flow MRI acquisition, the extracted imaging markers may correspond to diffusion, which can be used to determine one or both of diffusivity and/or velocity (flow) information.

In addition to the MR imaging, in the depicted example non-MR data is also acquired for the patient 26, such as concurrent with the MRI scan. In this example, one or more of electroencephalogram (EEG), electrocardiogram (ECG), visual camera (e.g., SMARTVISION), or other non-MRI data types are acquired (step 170). The non-MRI data and the biomarkers extracted from the reconstructed MR images may be synchronized or otherwise matched up (step 174) as part of an analysis routine or routines. By way of example, in one implementation the non-MR imaging inputs (such as EEG, ECG, and/or visual camera detection) are synchronized with the imaging biomarkers extracted from MR images to correlate the imaging biomarkers with non-imaging events (e.g., cardiac or brain activity, patient motion, and so forth). As shown in the depicted example, the outputs 180 of such an analysis routine may be one or more of brain activation data (such as may be acquired in fMRI acquisitions) or diffusivity data and/or velocity measurements (such as may be acquired in diffusion or flow MRI acquisitions). In the depicted example, the outputs 180 may in turn be used to re-parameterize or otherwise control additional MRI acquisitions 150, such as over the course of a sleep study. In contexts where the output is brain activation data, such brain activation outputs may be used to detect or determine brain waves, such as Delta waves, that can be used to infer a stage of sleep of the patient 26.

Technical effects of the invention include a reduced acoustic noise and vibration MRI acquisition suitable for use in sleep studies or in examinations where a quiet environment is desired during the MRI examination. In certain implementations acoustic noise levels for one or more MRI pulse sequences are characterized and modified by limiting the frequencies and amplitudes of the gradient waveforms so as to produce less noise and vibration when the modified waveform is used during an MRI examination. In this manner, relatively low sound pressure levels can be attained that are conducive to the patient being able to sleep while being imaged.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for performing a magnetic resonance (MR) image acquisition, comprising the steps of:
for an acoustically dominant gradient axis of the MR image acquisition:
calculating a sound-pressure-level spectrum (SPLS) by weighting a gradient waveform amplitude spectrum with an acoustic response function (ARF) of an MR imaging system;
selecting one or more frequencies within a frequency range on the ARF, wherein the one or more frequencies are selected to reduce acoustic noise;
computing a modified gradient waveform using the one or more frequencies;
synchronizing gradient waveforms on one or more other axes with the modified gradient waveform; and
using the modified gradient waveform in the MR image acquisition to acquire MR image data;
wherein the SPLS is calculated by multiplying the acoustic response function (ARF) of the MR imaging system with the gradient waveform amplitude spectrum.

2. The method of claim 1, wherein the MR image acquisition will be performed using the MR imaging system and the acoustic response is specific to the MR imaging system such that the SPLS is also specific to the MR imaging system.

3. The method of claim 1, wherein selecting the one or more frequencies comprises identifying one or more local lows or minima within the ARF and selecting the one or more frequencies associated with the local lows or minima.

4. The method of claim 1, wherein selecting the one or more frequencies comprises selecting one or more frequencies that are equal to or higher than a minimum frequency of the frequency range that minimize the acoustic noise.

5. The method of claim 1, wherein the modified gradient waveform, when performed by the MR imaging system, produces less acoustic noise than the respective gradient waveform.

6. The method of claim 1, wherein computing the modified gradient waveform comprises modifying frequencies and amplitudes of the respective gradient waveform based on the one or more frequencies.

7. The method of claim 1 wherein the magnetic resonance (MR) image acquisition comprises one of a functional MR image (fMRI) acquisition or a diffusion or flow MR image acquisition.

8. The method of claim 1, wherein the steps of calculating, selecting, computing, synchronizing, and using are separately performed, for respective acoustically dominant gradient axes, on different time-based segments of a pulse sequence associated with the MR image acquisition.

9. A magnetic resonance (MR) imaging system, comprising:
an MR scanner comprising primary magnet coils, gradient coils, and an RF coil; and
control and analysis circuitry in communication with the MR scanner and configured to operate the primary magnet coils, gradient coils, and the RF coil, wherein the control and analysis circuitry is configured to execute one or more stored routines to cause acts to be performed comprising:
for an acoustically dominant gradient axis of the MR image acquisition:
calculating a sound-pressure-level spectrum (SPLS) by weighting a gradient waveform amplitude spectrum with an acoustic response function (ARF) of the MR imaging system;
selecting one or more frequencies within a frequency range on the ARF, wherein the one or more frequencies are selected to reduce acoustic noise;
computing a modified gradient waveform using the one or more frequencies;
synchronizing gradient waveforms on one or more other axes with the modified gradient waveform; and
executing a pulse sequence on the MR imaging system based on the modified gradient waveform to acquire MR image data;
wherein the SPLS is calculated by multiplying the acoustic response function (ARF) of the MR imaging system with the gradient waveform amplitude spectrum.

10. The MR imaging system of claim 9, wherein the acoustic response function (ARF) is specific to the MR imaging system such that the SPLS is also specific to the MR imaging system.

11. The MR imaging system of claim 9, wherein selecting the one or more frequencies comprises identifying one or more local lows or minima within the ARF and selecting the one or more frequencies associated with the local lows or minima.

12. The MR imaging system of claim 9, wherein the modified gradient waveform, when performed by the MR imaging system, produces less acoustic noise than the respective gradient waveform.

13. The MR imaging system of claim 9, wherein computing the modified gradient waveform comprises modifying frequencies and amplitudes of the respective gradient waveform based on the one or more frequencies.

14. The MR imaging system of claim 9, wherein the control and analysis circuitry is configured to cause the respective acts of calculating, selecting, computing, synchronizing, and executing to be separately performed, for respective acoustically dominant gradient axes, on different time-based segments of a pulse sequence associated with the MR image acquisition.

15. A method for acquiring magnetic resonance (MR) images of a patient, comprising the steps of:
for one or more pulse sequences, calculating a sound-pressure-level spectrum (SPLS) based on an acoustic response function (ARF) of an MR imaging system and a gradient waveform amplitude spectrum of a respective gradient waveform from an acoustically dominant axis of each pulse sequence;
for each SPLS, selecting one or more frequencies by identifying one or more local lows or minima within the ARF and selecting the one or more frequencies associated with the local lows or minima;
computing, for each SPLS, a modified gradient waveform using the one or more frequencies;
synchronizing gradient waveforms on one or more other axes with the modified gradient waveform;
acquiring MR scan data of the patient using one or more pulse sequences based on the modified gradient waveforms;
reconstructing one or more images based on the MR scan data;
extracting one or more imaging biomarkers from the one or more images;

acquiring non-MR sensor data of a sleeping patient; and
synchronizing the one or more imaging biomarkers and the non-MR sensor data to generate one or more outputs.

16. The method of claim 15, wherein the non-MR sensor data comprises one or more of an electroencephalogram (EEG), an electrocardiogram (ECG), or visual camera data.

17. The method of claim 15, wherein the one or more images are functional MR images (fMRI) and the one or more outputs correspond to brain activation data.

18. The method of claim 17, further comprising:
detecting one or more brain waves using the brain activation data; and
inferring a stage of sleep based on the one or more brain waves.

19. The method of claim 15, wherein the one or more images are diffusion or flow MR images and the one or more imaging biomarkers correspond to diffusivity, velocity, or flow.

20. The method of claim 15, further comprising performing an additional MR image acquisition based on parameters determined using the one or more outputs.

* * * * *